United States Patent [19]
Gleason et al.

[11] Patent Number: 4,728,902
[45] Date of Patent: Mar. 1, 1988

[54] STABILIZED CASCODE AMPLIFIER

[75] Inventors: Jeffrey Gleason, Minneapolis; Richard E. Hester, Eden Prairie, both of Minn.

[73] Assignee: VTC Incorporated, Bloomington, Minn.

[21] Appl. No.: 904,938

[22] Filed: Sep. 8, 1986

[51] Int. Cl.⁴ .............................................. H03F 3/45
[52] U.S. Cl. .................................... 330/261; 330/296; 330/311
[58] Field of Search ................ 330/261, 296, 307, 311

[56] References Cited

U.S. PATENT DOCUMENTS 3,991,381  11/1976  Sechi ........................... 330/296 X
4,528,517  7/1985  Schlotzhauer ................. 330/311

*Primary Examiner*—James B. Mullins
*Attorney, Agent, or Firm*—Kinney & Lange

[57] ABSTRACT

A bipolar integrated circuit amplifier with a cascode stage has an emitter follower biasing circuit which provides a bias voltage to the cascode stage. The cascode amplifier stage is stabilized by providing a stabilization capacitance across the base-collector junction of the emitter follower in the biasing circuit.

12 Claims, 1 Drawing Figure

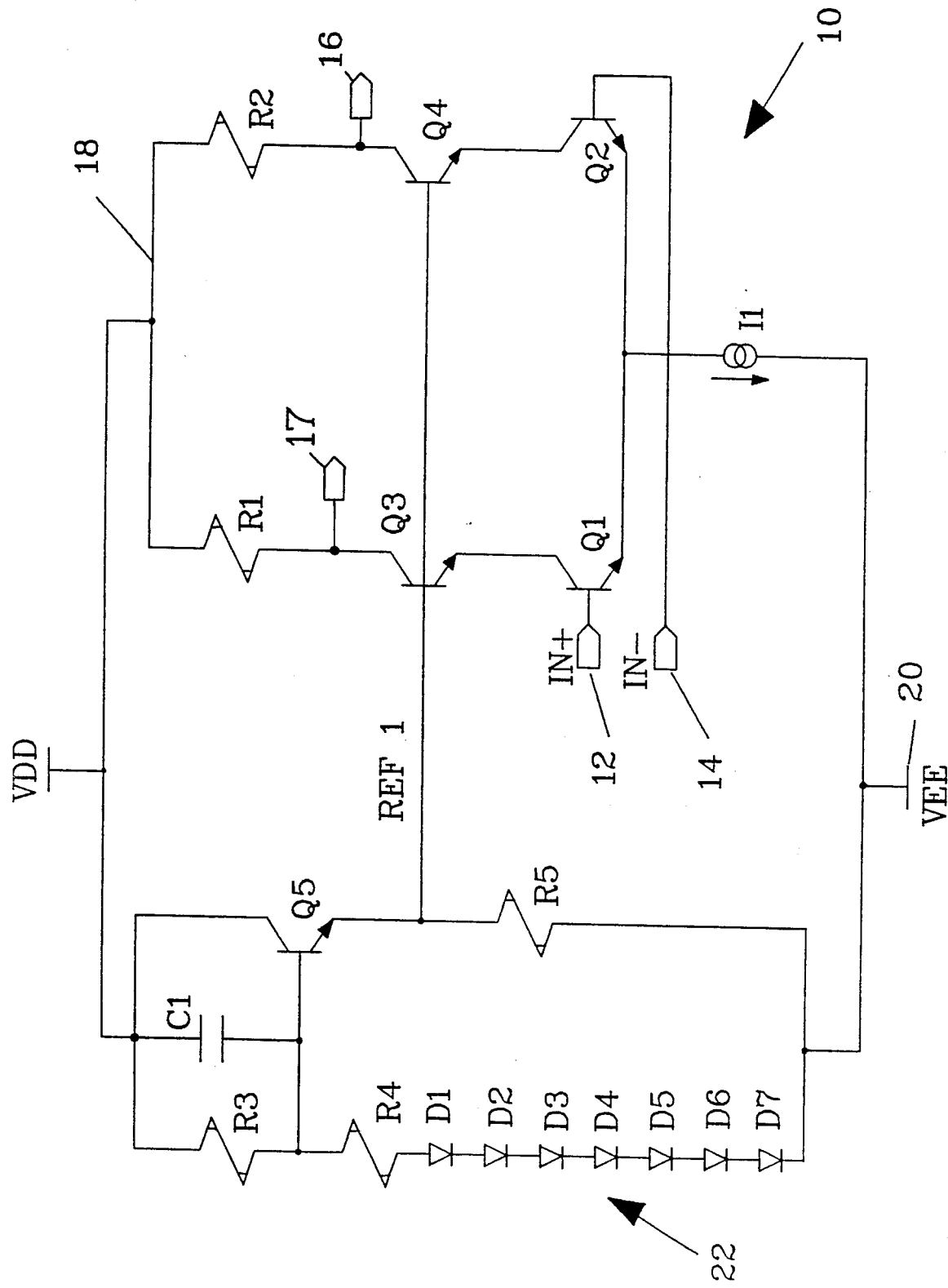

STABILIZED CASCODE AMPLIFIER

BACKGROUND OF THE INVENTION

1. Field of the Invention.

The present invention relates to a bipolar integrated circuit amplifier. In particular, the present invention is an improved amplifier circuit having a cascode amplifier stage.

2. Description of the Prior Art.

The use of a cascode stage to broad band an amplifier stage is commonly used and practiced in integrated circuit design. This configuration, however, is prone to instability and becomes more susceptable to oscillation with increased current levels which are desirable in low noise applications.

One typical amplifier having a cascode amplifier stage is a differential amplifier having a pair of transistors with their emitters connected together and their bases connected to receive the two input signals. The collector of the two differential amplifier transistors are connected to the emitters of the cascode stage transistors. The bases of the cascode stage transistors are connected to a bias voltage. The collectors of the cascode stage transistors are connected through resistors to a supply line.

In the prior art, attempts have been made to stabilize the cascode amplifier stage of the differential amplifier circuit by including resistors in the emitters of the cascode transistors or by using compensation capacitors between the supply line and the collectors of the cascode transistors. Both of these prior art methods decrease the frequency response of the amplifier circuit. In addition, emitter resistors increase the differential input capacitance of the differential amplifier transistors. Low input capacitance is extremely important in applications where the driving source of the amplifier is an inductive load, such as a read/write head of a magnetic storage device.

SUMMARY OF THE INVENTION

The present invention is based upon the discovery that stabilization of an amplifier having a cascode stage can be achieved by providing additional base-collector capacitance to the transistor of the emitter follower biasing circuit used to provide the bias voltage for biasing the cascode stage. This stabilization capacitance across the base-collector junction has been found to stabilize a cascode type amplifier without band limiting the amplifier's frequency response. Stabilization is also achieved without sacrificing low input capacitance.

BRIEF DESCRIPTION OF THE DRAWING

The FIGURE shows a stabilized cascode differential amplifier of the present invention.

DETAILED DESCRIPTION OF THE PREFERRED EMBODIMENTS

Cascode differential amplifier 10 includes a differential amplifier having a pair of input terminals 12 and 14 and a pair of output terminals 16 and 17. Power is supplied to amplifier 10 at a pair of supply terminals 18 and 20.

NPN transistors Q1 and Q2 have their bases connected to input terminals 12 and 14, respectively. The emitters of Q1 and Q2 are connected together to current source I1.

NPN transistors Q3 and Q4 form a cascode stage. The emitter of Q3 is connected to the collector of Q1, and the emitter of Q4 is connected to the collector of Q2. The collector of Q3 is connected through resistor R1 to supply terminal 18, and the collector of Q4 is connected through resistor R2 to supply terminal 18. The bases of Q3 and Q4 receive a bias voltage REF 1 from an emitter follower bias circuit 22 formed by transistor Q5, resistors R3-R5, diodes D1-D7, and capacitor C1.

Resistors R3 and R4 and diodes D1-D7 are connected in series between terminals 18 and 20 to orm a voltage divider which applies a base voltage to transistor Q5. Q5 is an NPN transistor having its collector connected to supply terminal 18 and its emitter connected through resistor R5 to supply terminal 20. The bias voltage REF 1 is derived from the emitter of Q5.

We have discovered that by including capacitor C1 across the base collector junction of transistor Q5, the favorable stable operation of the cascode differential amplifier is achieved without band limiting the frequency response and without sacrificing low input capacitance. Normally, the base-collector capacitance of Q5 is on the order of about 0.1 to 0.2 pf. Capacitance C1 is on the order of about 1 to about 100 pf, and preferably about 4 pf. In a preferred embodiment of the present invention, capacitor C1 is a junction capacitor formed in parallel with the base collector junction of transistor Q5. Alternatively, capacitor C1 and the base-collector junction of Q5 can be combined simply by making the base-collector junction larger while retaining the same size emitter as when the two capacitances were separate. Capacitance C1, however, can be any type of capacitor, not necessarily a junction capacitor.

Although the present invention has been described with reference to preferred embodiments, workers skilled in the art will recognize that changes may be made in form and detail without departing from the spirit and scope of the invention. For example, although the preferred embodiment shown in the Figure is a differential amplifier having a cascode stage, the present invention is also applicable to single-ended amplifiers having a cascode stage which receives a bias potential from an emitter follower bias generator. In addition, R5 can be replaced by a current source, and R3, R4 and D1-D7 can be replaced by other circuits which generate a bias voltage at the base of Q5.

What is claimed is:

1. A bipolar integrated circuit amplifier having a cascode stage which receives a bias voltage from an emitter-follower bias circuit which includes a transistor having a base, an emitter and a collector, means for providing a base voltage to the base of the transistor, means for deriving the bias voltage from the emitter of the transistor, and stabilization capacitance means between the base and collector of the transistor for stabilizing the cascode stage of the bipolar integrated circuit amplifier.

2. The invention of claim 1 wherein the stabilization capacitance means has a capacitance of between about 1 pf and about 100 pf.

3. The invention of claim 1 wherein the stabilzation capacitance means has a capacitance of about 4 pf.

4. The invention of claim 1 wherein the means for providing a base voltage includes a voltage divider connected between first and second supply terminals.

5. The invention of claim 4 wherein the transistor has its collector connected to the first supply terminal and its emitter connected through a load to the second supply terminal.

6. The invention of claim 1 wherein the amplifier has a differential amplifier stage connected to the cascode stage.

7. The invention of claim 6 wherein the differential amplifier stage includes first and second differential stage transistors having bases connected to first and second input terminals, respectively; having emitters connected together to a current source; and having collectors connected to the cascode stage.

8. The invention of claim 7 wherein the cascode stage includes first and second cascode stage transistors having bases connected to the bias circuit to receive the bias voltage and having emitters connected to the collectors of the first and second differential stage transistors, respectively.

9. The invention of claim 8 wherein the first and second cascode stage transistors have collectors connected through first and second resistance means to a first supply terminal.

10. The invention of claim 9 wherein the first and second differential stage transistors are NPN transistors and the first and second cascode stage transistors are NPN transistors.

11. The invention of claim 10 wherein the transistor of the bias is an NPN transistor.

12. The invention of claim 1 wherein the stabilzation capacitance means is a junction capacitor.

* * * * *

UNITED STATES PATENT AND TRADEMARK OFFICE
CERTIFICATE OF CORRECTION

PATENT NO. : 4,728,902

DATED : March 1, 1988

INVENTOR(S) : Jeffrey Gleason et al.

It is certified that error appears in the above-identified patent and that said Letters Patent is hereby corrected as shown below:

Column 4, line 12, after the word "bias", insert --circuit--.

Signed and Sealed this

Nineteenth Day of July, 1988

Attest:

DONALD J. QUIGG

Attesting Officer     Commissioner of Patents and Trademarks